US011137438B2

(12) United States Patent
Hernes

(10) Patent No.: US 11,137,438 B2
(45) Date of Patent: Oct. 5, 2021

(54) SYSTEMS AND METHODS FOR TESTING ELECTRICAL LEAKAGE

(71) Applicant: Disruptive Technologies Research AS, Blomsterdalen (NO)

(72) Inventor: Bjornar Hernes, Trondheim (NO)

(73) Assignee: Disruptive Technologies, Lysaker (NO)

( * ) Notice: Subject to any disclaimer, the term of this patent is extended or adjusted under 35 U.S.C. 154(b) by 166 days.

(21) Appl. No.: 15/505,640

(22) PCT Filed: Aug. 24, 2015

(86) PCT No.: PCT/IB2015/001831
§ 371 (c)(1),
(2) Date: Feb. 22, 2017

(87) PCT Pub. No.: WO2016/027161
PCT Pub. Date: Feb. 25, 2016

(65) Prior Publication Data
US 2017/0285088 A1    Oct. 5, 2017

Related U.S. Application Data

(60) Provisional application No. 62/040,659, filed on Aug. 22, 2014.

(51) Int. Cl.
*G01R 31/28* (2006.01)
*G01R 31/52* (2020.01)

(52) U.S. Cl.
CPC ..... *G01R 31/2812* (2013.01); *G01R 31/2851* (2013.01); *G01R 31/52* (2020.01)

(58) Field of Classification Search
CPC .......................... G01R 31/025; G01R 31/2812
See application file for complete search history.

(56) References Cited

U.S. PATENT DOCUMENTS

| | | | | |
|---|---|---|---|---|
| 2011/0213950 | A1* | 9/2011 | Mathieson | G06F 1/206 712/30 |
| 2012/0112755 | A1* | 5/2012 | Nishizawa | G01R 31/362 324/433 |
| 2013/0043889 | A1 | 2/2013 | Guo | |
| 2013/0193907 | A1 | 8/2013 | Thomas | |
| 2013/0278227 | A1 | 10/2013 | Knitt | |
| 2014/0141242 | A1* | 5/2014 | Phillips | B29B 15/08 428/383 |
| 2014/0291687 | A1* | 10/2014 | Nagasawa | H01L 27/3276 257/72 |

OTHER PUBLICATIONS

Preliminary Report for related International Application No. PCT/IB2015/001831; report dated Mar. 9, 2017.

* cited by examiner

*Primary Examiner* — Paresh Patel

(57) ABSTRACT

A method of testing a self-contained device under test having at least a circuit under test and a power source is provided. The method may include at least temporarily enabling power from the power source to the circuit under test, determining a first voltage across the circuit under test, determining a second voltage across the circuit under test after a test duration, and calculating an average current of the circuit under test based at least partially on the first voltage, the second voltage and the test duration.

20 Claims, 2 Drawing Sheets ial Application No. PCT/IB2015/001831
SYSTEMS AND METHODS FOR TESTING ELECTRICAL LEAKAGE

CROSS-REFERENCE TO RELATED APPLICATION

This Application is a 35 USC § 371 US National Stage filing of International Application No. PCT/IB2015/001831 filed on Aug. 24, 2015, and claims priority under the Paris Convention to U.S. Provisional Patent Application No. 62/040,659 filed on Aug. 22, 2014.

TECHNICAL FIELD

The present disclosure relates generally to manufacturing electrical devices, and more particularly, to systems and methods for testing leakage current in circuits of electrical devices.

BACKGROUND

Increasing battery lifetime is a common and often a critical concern in the development of a wide array of portable electronic devices. One of the more significant obstacles to improving battery life is leakage current. Generally, leakage current refers to undesired current flow within the circuitry of a battery-powered device which remains even after the device has been powered down or put in an off state, and active current refers to current flow within the circuitry of a battery-powered device while in an on state. In order to ensure that a manufactured device meets the desired specifications in terms of battery life, both of the active current and the leakage current must be tested on each individual device. In some devices, the active current is about as low as any leakage current, and therefore, there is not much need to distinguish between the two types of current during testing. However, testing for leakage current in the nano-ampere range can be extremely challenging and time consuming due to the low current levels and capacitors that need to be charged or discharged to yield an observable voltage difference.

Conventional approaches to testing semiconductors and printed circuit boards (PCBs) typically involve connecting a device under test to a test fixture and performing the test while the device under test is connected. In the end, the overall time and cost expended on these tests can be substantial when considering the significant number of devices that need to be tested and the time it takes to test each device. One workaround may be to simultaneously perform several of these tests on several devices in parallel. However, such a workaround requires substantial infrastructure to be carried out effectively, and even then, can still become financially impractical at some point due to the amount of infrastructure involved. Alternatively, testing leakage current in a heavily decoupled power domain may take a significant amount of time to accumulate the necessary voltage differences due to significantly large time constants.

In view of the foregoing setbacks and disadvantages associated with conventional testing systems, a need therefore exists for an improved method or system for testing leakage current that is cost-effective, time-efficient and perhaps even self-contained to save on the amount of infrastructure involved.

SUMMARY OF THE DISCLOSURE

In one aspect of the present disclosure, a method of testing a self-contained device under test having at least a circuit under test and a power source is provided. The method may include at least temporarily enabling power from the power source to the circuit under test, determining a first voltage across the circuit under test, determining a second voltage across the circuit under test after a test duration, and calculating an average current of the circuit under test based at least partially on the first voltage, the second voltage and the test duration.

In another aspect of the present disclosure, a device under test is provided. The device under test may include a power source, a circuit under test, and a testing device in communication with each of the power source and the circuit under test. The testing device may be configured to at least temporarily enable power from the power source to the circuit under test, determine a first voltage across the circuit under test, determine a second voltage across the circuit under test after a test duration, and calculate an average current of the circuit under test based at least partially on the first voltage, the second voltage and the test duration.

In yet another aspect of the present disclosure, a device for testing a circuit under test is provided. The device may include a timer module configured to define a test duration, a measurement module configured to measure at least a voltage across the circuit under test, a switch module configured to selectively couple a power source to the circuit under test, and a sequencing module in communication with each of the timer module, the measurement module and the switching module. The sequencing module may be configured to at least temporarily enable power from the power source to the circuit under test, measure a first voltage, measure a second voltage after the test duration, and calculate an average current of the circuit under test based at least partially on the first voltage, the second voltage and the test duration.

BRIEF DESCRIPTION OF THE DRAWINGS

FIG. 3 is a flowchart of one exemplary method of testing a circuit under test that is designed in accordance with the teachings of the present disclosure.

DETAILED DESCRIPTION

Figure 1:
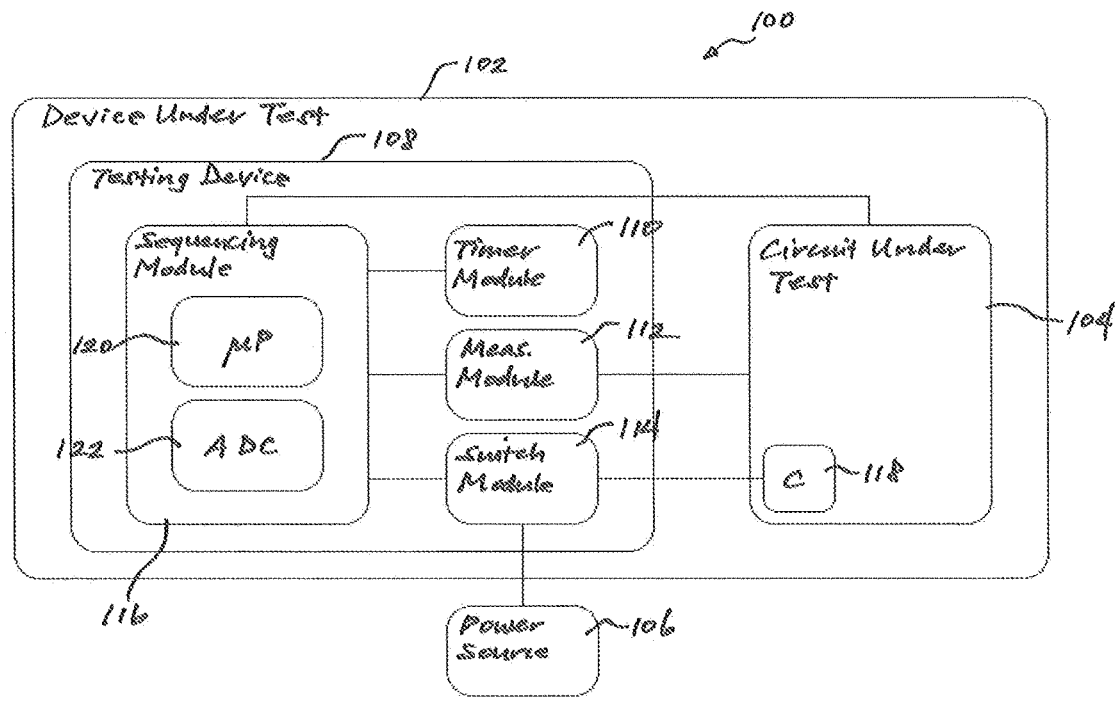
FIG. 1 is a diagrammatic illustration of one exemplary system for testing a circuit under test that is constructed in accordance with the teachings of the present disclosure.

Referring now to FIG. 1, one exemplary embodiment of a testing system 100 that may be used to test for active and/or leakage current within a device under test 102 is provided. In general, the testing system 100 may include at least the circuitry of the device under test 102 to be tested, or the circuit under test 104, as well as an appropriate power supply or power source 106, and a testing device 108. In the particular embodiment shown, each of at least the circuit under test 104 and the testing device 108 may be self-contained within the device under test 102. In related modifications, the power source 106 may also be self-contained within the device under test 102. Notably, any one or more of the components of the testing device 108 and/or the power source 106 may be implemented using already existing circuit components within the device under test 102 so as to bypass the need for additional infrastructure as is typically required in conventional testing applications.

Moreover, any one or more of the components of the testing device 108 and/or the power source 106 depicted may later, typically after testing has been successfully performed, be reconfigured for normal operation of the device under test 102. The reconfiguration may be initiated, for instance, by the device under test 102 itself, by other system components, by an end-user, or any combination thereof.

Figure 2:
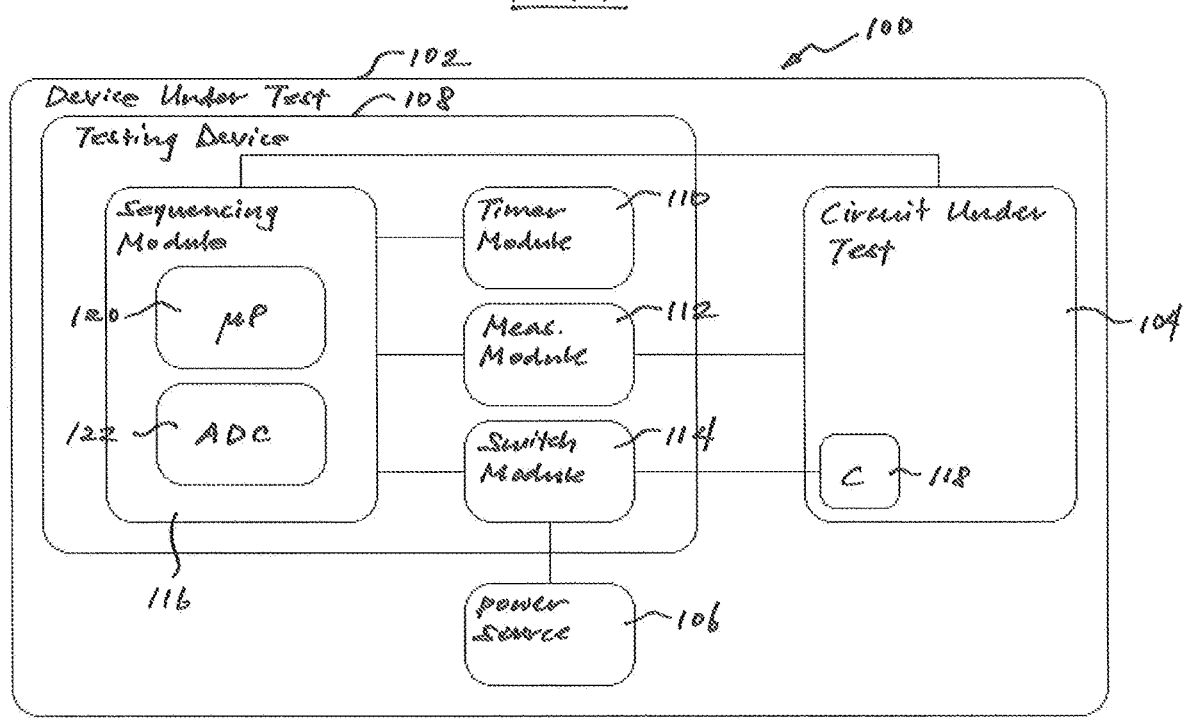
FIG. 2 is a diagrammatic illustration of another exemplary system for testing a circuit under test that is also constructed in accordance with the teachings of the present disclosure.
Figure 2:
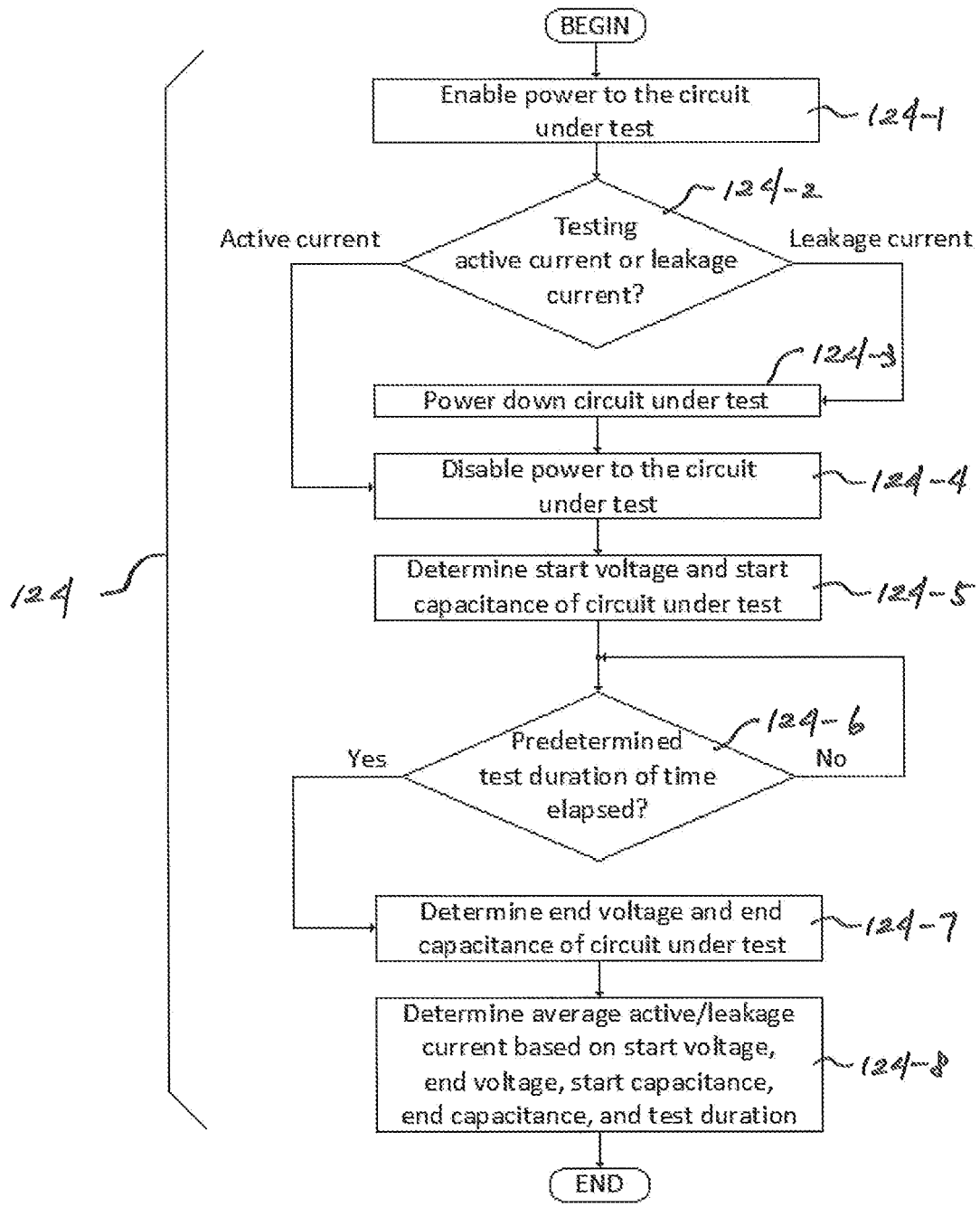

In one example, a self-contained device under test 102 constructed in accordance with the embodiment of FIG. 1, once manufactured, may need only to be connected to the power source 106 in order to initialize a self-test either manually or automatically. In another example, as shown in the embodiment of FIG. 2, for example, the device under test 102 may be manufactured to self-contain not only the testing device 108, but also the power source 106, and thus, may need not be connected to any infrastructure in order to initialize a self-test. For example, a battery that is being used as the power source 106 may be integrated into the final design of the device under test 102, and a small portion of the stored energy may be allocated for initializing and performing self-tests. Self-tests may be performed at system initialization or at intervals during system operation. Furthermore, in any given system and/or during any given self-test, there may be several circuits under test 104, where any two or more of the circuits under test 104 may be the same, comparable or different from one another, and/or capable of performing a self-test on one another. Other testing arrangements may also be possible and will be apparent to those of ordinary skill in the art. For simplicity, the following descriptions will be made in reference to the embodiments shown in both FIGS. 1 and 2.

While the power source 106 may be provided either separate from the device under test 102 as shown in FIG. 1 or within the device under test 102 as shown in FIG. 2, the testing device 108 in either arrangement may be configured to test the active current and/or the leakage current within the circuit under test 104. As shown, the testing device 108 may be in communication with each of the circuit under test 104 and the power source 106, and in essence, configured as an interface disposed therebetween. Furthermore, each of the modular components illustrated within the testing device 108 may be representative of hardware, software, or combinations thereof, that are configured to perform one or more functions of the testing device 108. For example, the testing device 108 may be preprogrammed according to one or more algorithms that may generally be categorized into at least a timer module 110, a measurement module 112, a switch module 114, and a sequencing module 116. While only one possible schematic of the testing device 108 is provided, it will be understood that the testing device 108 may additionally or alternatively be composed of other modules or other arrangements of modules capable of providing comparable results.

Still referring to FIGS. 1 and 2, the timer module 110 of the testing device 108 may be configured to at least define a test duration, or a predefined interval of time which temporally spans between at least a starting point and an ending point for the test to be conducted on the circuit under test 104. More particularly, each of the starting point and the ending point may correspond to a measuring event to be performed by the measurement module 112, for example, to measure one or more of a voltage across the circuit under test 104, to determine a capacitance of the circuit under test 104, or to assess any other relevant parameter thereof. In other modifications, the timer module 110 may define multiple test durations or multiple intervals of time spanning between additional testing points or measuring events. Furthermore, the test duration may be predefined at least partially based on the value of current that is anticipated or expected to be found within the circuit under test 104. The test duration may also be predefined based at least partially on the total capacitance of the circuit under test 104. Other parameters of the circuit under test 104 not mentioned herein may also be relied up on to determine the test duration.

In addition, the measurement module 112 of FIGS. 1 and 2 may be disposed in communication with the circuit under test 104 and configured to measure the voltage across the circuit under test 104 as well as the capacitance thereof. For example, the measurement module 112 may be electrically coupled in parallel to a common bus of the circuit under test 104, or the like. Moreover, the measurement module 112 may be directly or indirectly operated in part by the timer module 110, such that the desired measurements are taken in accordance with the test duration. For example, the measurement module 112 may perform measurements once at the starting point of the test duration and once at the ending point of the test duration, as defined by the timer module 110. In other embodiments, the measurement module 112 may also perform measurements at additional points within a given test duration, or within additional test durations, as the case may be. In still further modifications, it may be possible to configure the measurement module 112 to determine parameters other than the voltage and the capacitance of the circuit under test 104 to provide comparable results.

Furthermore, the switch module 114 of FIGS. 1 and 2 may be electrically disposed between the power source 106 and the circuit under test 104, or a decoupling capacitor 118 that is connected in parallel to the circuit under test 104, and, while the sequencing module 116 may be in operative communication with each of the timer module 110, the measurement module 112, and the switch module 114. More specifically, the switch module 114 may be configured to selectively couple or decouple the power source 106 to or from the circuit under test 104 during testing based on input from the sequencing module 116, and the sequencing module 116 may be configured to sequentially operate each of the timer module 110, the measurement module 112, and the switch module 114 to automatically conduct a test on the circuit under test 104. As shown, the sequencing module 116 may include at least a microprocessor 120 and an analog to digital converter 122 for performing or conducting a test on the circuit under test 104. However, the sequencing module 116 may alternatively incorporate any other programmable device that may be configured to operate according to one or more preprogrammed algorithms for calculating either the active current or the leakage current within the circuit under test 104.

Turning to FIG. 3, one exemplary algorithm or method 124 for testing a circuit under test 104 is diagrammatically provided, according to which the testing system 100, the testing device 108 or the sequencing module 116 thereof may be configured to operate. For example, in block 124-1, the sequencing module 116 may initially engage the switch module 114 to connect the circuit under test 104 to the capacitor 118 and/or to the power source 106 to enable power to the circuit under test 104. As shown in block 124-2, the sequencing module 116 may then determine whether active current or leakage current is to be tested. If leakage current is to be tested, the sequencing module 116 may power down the circuit under test 104 as shown in block 124-3, and proceed to block 124-4 to disable power to the circuit under test 104. For example, the sequencing module 116 in block 124-4 may be configured to again engage the switch module 114 to disconnect the power source 106 from the capacitor 118 of the circuit under test 104. If, however, active current is to be tested, the sequencing module 116 may bypass block 124-3 and proceed to block 124-4 without first powering down the circuit under test 104.

According to block 124-5 of FIG. 3, the sequencing module 116 may measure a first voltage, or the start voltage across the circuit under test 104 measured at the starting point of the test duration defined by the timer module 110. The sequencing module 116 in block 124-5 may additionally determine a first capacitance, or the capacitance in the circuit under test 104 determined at the starting point of the test duration. As shown in block 124-6, the sequencing module 116 may then hold further actions until the test duration defined by the timer module 110 has elapsed. When the test duration ends, or at the ending point, the sequencing module 116 in block 124-7 may be configured to take another set of measurements of the circuit under test 104. For example, similar to block 124-4, the sequencing module 116 in block 124-7 may again measure a second voltage, or the end voltage across the circuit under test 104 measured at the ending point of the test duration defined by the timer module 110. The sequencing module 116 in block 124-6 may also determine a second capacitance, or the capacitance in the circuit under test 104 at the ending point of the test duration. Once at least two sets of measurements are obtained, the sequencing module 116 in block 124-8 may determine either the average active current or the average leakage current within the circuit under test 104, whichever is applicable per block 124-2. Specifically, the sequencing module 116 may be configured to calculate the average active or leakage current based on one or more of the difference between the first and second voltages, the total capacitance at the starting and ending points, the test duration, and any other related factors or parameters.

While only one possible scheme of testing a circuit under test 104 is shown, it will be understood that other comparable schemes will be apparent to those of ordinary skill in the art. For example, one or more of the processes, steps or blocks in FIG. 3 may be omitted, combined or performed simultaneously, performed in a different sequence than as shown, or the like. Furthermore, the method 124 of FIG. 3 may also incorporate additional processes, steps or blocks not shown. The method 124 of FIG. 3 may also configure the sequencing module 116 to conduct other measurements of the circuit under test 104 and/or calculate the average active or leakage current using other variables or relationships. Additionally or optionally, the sequencing module 116 may further be configured to output the calculations or determinations made in block 124-8 in the readable form. For example, the sequencing module 116 may digitally output the test results or data via any one or more output devices associated with the testing system 100, or the testing device 108 thereof.

From the foregoing, it will be appreciated that while only certain embodiments have been set forth for the purposes of illustration, other alternatives and modifications will be apparent from the above description to those skilled in the art. These and other alternatives are considered equivalents and within the spirit and scope of this disclosure and the appended claims.

What is claimed is:

1. A method of testing a self-contained device under test having at least a circuit under test and a power source in a first configuration, comprising:
at least temporarily enabling power from the power source to the circuit under test while the self-contained device under test is in the first configuration;
determining a first voltage across the circuit under test;
determining a second voltage across the circuit under test after a test duration while the self-contained device under test remains in the first configuration; and
calculating an average current of the circuit under test based at least partially on the first voltage, the second voltage and the test duration.

2. The method of claim 1, wherein the calculated average current corresponds to an average active current of the circuit under test.

3. The method of claim 1, further comprising:
powering down the circuit under test after enabling power from the power source to the circuit under test and prior to determining the first voltage across the circuit under test,
the calculated average current corresponding to an average leakage current of the circuit under test.

4. The method of claim 1, further comprising:
disabling power from the power source to the circuit under test at a time that is one of prior to determining the first voltage across the circuit under test, and after determining the first voltage across the circuit under test.

5. The method of claim 1, further comprising:
determining a first capacitance across the circuit under test; and
determining a second capacitance across the circuit under test after the test duration.

6. The method of claim 1, wherein the test duration is defined based on an expected current value and a total capacitance of the circuit under test.

7. The method of claim 1, wherein the average current is calculated based on one or more of a difference between the first voltage and the second voltage, a total capacitance of the circuit under test, and the test duration.

8. A device under test, comprising:
a power source;
a circuit under test; and
a testing device in communication with each of the power source and the circuit under test in a first configuration, the testing device configured to at least temporarily enable power from the power source to the circuit under test while the circuit under test is in the first configuration, determine a first voltage across the circuit under test, determine a second voltage across the circuit under test after a test duration while the circuit under test remains in the first configuration, and calculate an average current of the circuit under test based at least partially on the first voltage, the second voltage and the test duration.

9. The device under test of claim 8, wherein the testing device is configured to calculate an average active current of the circuit under test.

10. The device under test of claim 8, wherein the testing device is configured to power down the circuit under test after enabling power from the power source to the circuit under test and prior to determining the first voltage across the circuit under test, and calculate an average leakage current of the circuit under test.

11. The device under test of claim 8, wherein the testing device is configured to determine a first capacitance across the circuit under test, and determine a second capacitance across the circuit under test after the test duration.

12. The device under test of claim 8, wherein the testing device is configured to define the test duration based on an expected current value and a total capacitance of the circuit under test.

13. The device under test of claim 8, wherein the testing device is configured to calculate the average current based on one or more of a difference between the first voltage and the second voltage, a total capacitance of the circuit under test, and the test duration.

14. A device for testing a circuit under test, comprising:
a timer module configured to define a test duration;
a measurement module configured to measure at least a voltage across the circuit under test;
a switch module configured to selectively couple a power source to the circuit under test; and
a sequencing module in communication with each of the timer module, the measurement module and the switching module, the sequencing module being configured to at least temporarily enable power from the power source to the circuit under test while the circuit under test is in a first configuration, measure a first voltage, measure a second voltage after the test duration while the circuit under test is still in the first configuration, and calculate an average current of the circuit under test based at least partially on the first voltage, the second voltage and the test duration.

15. The device of claim 14, wherein the circuit under test is disposed within a manufactured device under test, and wherein each of the timer module, the measurement module, the switch module, the sequencing module, and the power source is implemented and self-contained within the device under test.

16. The device of claim 14, wherein the sequencing module is configured to calculate an average active current of the circuit under test.

17. The device of claim 14, wherein the sequencing module is configured to power down the circuit under test after enabling power the power source to the circuit under test and prior to measuring the first voltage, and calculate an average leakage current of the circuit under test.

18. The device of claim 14, wherein the measurement module is configured to determine a capacitance of the circuit under test, the sequencing module being configured to determine a first capacitance across the circuit under test, and determine a second capacitance across the circuit under test after the test duration.

19. The device of claim 14, wherein the timer module is configured to define the test duration based on an expected current value and a total capacitance of the circuit under test.

20. The device of claim 14, wherein the sequencing module is configured to calculate the average current based on one or more of a difference between the first voltage and the second voltage, a total capacitance of the circuit under test, and the test duration.

* * * * *